(12) United States Patent
Allen et al.

(10) Patent No.: US 6,986,109 B2
(45) Date of Patent: Jan. 10, 2006

(54) PRACTICAL METHOD FOR HIERARCHICAL-PRESERVING LAYOUT OPTIMIZATION OF INTEGRATED CIRCUIT LAYOUT

(75) Inventors: Robert J. Allen, Jericho, VT (US); Fook-Luen Heng, Yorktown Heights, NY (US); Alexey Y. Lvov, Peekskill, NY (US); Kevin W. McCullen, Essex Junction, VT (US); Sriram Peri, South Burlington, VT (US); Gustavo E. Tellez, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 239 days.

(21) Appl. No.: 10/438,625

(22) Filed: May 15, 2003

(65) Prior Publication Data
US 2004/0230922 A1    Nov. 18, 2004

(51) Int. Cl.
*G06F 17/50* (2006.01)
(52) U.S. Cl. ................. 716/2; 716/1; 716/9; 716/10
(58) Field of Classification Search ................. 716/1, 716/2, 9, 10
See application file for complete search history.

(56) References Cited

U.S. PATENT DOCUMENTS

| | | | |
|---|---|---|---|
| 6,083,275 | A |  7/2000 | Heng et al. |
| 6,854,096 | B2 * | 2/2005 | Eaton et al. ............... 716/2 |
| 2002/0133797 | A1 * | 9/2002 | Sasagawa et al. .......... 716/9 |
| 2003/0182649 | A1 * | 9/2003 | Harn ...................... 716/11 |
| 2004/0225982 | A1 * | 11/2004 | Donelly et al. ............ 716/9 |
| 2004/0230931 | A1 * | 11/2004 | Barbee et al. ............ 716/10 |

OTHER PUBLICATIONS

Heng et al., "Application of Automated Design Migration to Alternating Phase Shift Mask Design", Proc. ISPD, pp. 38-43, Apr., 2001.

Liao et al., "An Algorithm to Compact a VLSI Symbolic Layout with Mixed Constraints", Proc. of DAC, Jun. 1983, pp. 107-112.

Lin et al., "Minplex—A Compactor that Minimizes the Bounding Rectangle and Individual Rectangles in a Layout", Proc. DAC, Jun., 1986, pp. 123-130.

(Continued)

*Primary Examiner*—Matthew Smith
*Assistant Examiner*—Magid Y. Dimyan
(74) *Attorney, Agent, or Firm*—McGinn & Gibb, PLLC; Richard Kotulak, Esq.

(57) ABSTRACT

The invention provides a method of modifying a hierarchical integrated circuit layout wherein the locations of hierarchical layout elements are represented with variables and formulae using these variables, which produces a formula-based hierarchical layout. These variables are constrained to be integers. The invention provides for a method for guiding the modification of the layout through an objective function defined on the same variables as the formula-based hierarchical layout. The invention simplifies the formula-based hierarchical layout by substituting constants for some of the variables, such that each of the formulae are reduced to expressions involving no more than two remaining variables. This produces a simplified layout equation and a simplified objective function. This also produces a partial solution to the hierarchical layout modification made up of the values selected for the constants.

35 Claims, 7 Drawing Sheets

OTHER PUBLICATIONS

Lee et al., "Himalayas—A Hierarchical Compaction System with a Minimized Constraint Set", Proc. ICCAD, 1992, pp. 150-157.

Marple, "A Hierarchy Preserving Hierarchical Compactor", Proc. 27th Design Automation Conf., pp. 375-381, 1990.

Heng et al., "A VLSI Artwork Legalization Technique Based on a New Criterion of Minimum Layout Perturbation", Proc. ISPD, pp. 116-121, 1997.

Chen et al., "A Fast Minimum Layout Perturbation Algorithm for Electromigration Reliability Enhancement", Proc. International Symposium on DFT in VLSI Systems, pp. 56-63, Nov., 1998.

* cited by examiner $E_j(x, T_{jm} \circ T_j(m-1) \circ ... \circ T_{j1}) - E_i(x, T_{im} \circ T_i(n-1) \circ ... \circ T_{i1}) \geq d_{ij}$ Variables of such a Hierarchical constraint include the Translation factors as well as $e_i(x)$ and $e_j(x)$ A Data-flow Macro before Hierarchical Modification A Data-flow Macro after Hierarchical Modification A Data-flow Macro before Hierarchical Modification A Data-flow Macro after Hierarchical Modification

PRACTICAL METHOD FOR HIERARCHICAL-PRESERVING LAYOUT OPTIMIZATION OF INTEGRATED CIRCUIT LAYOUT

BACKGROUND OF THE INVENTION

1. Field of the Invention

The present invention generally relates to hierarchical integrated circuit designs and more particularly to a system and methodology that simplifies the automated modification of the hierarchical design. The invention relates to automated modifications accomplished through the use of optimization which is guided by an objective function, and constrained by a formula-based hierarchical layout. The invention simplifies the formula in the formula-based hierarchical layout by the substitution of constants for selected variables such that only two-variable formulae remain in the simplified formula-based layout, thus enabling the use of practical, efficient optimization methods, specifically avoiding the need to solve general integer programming problems.

2. Description of the Related Art

Conventional systems that utilize integrated circuit design layout optimization techniques have been studied in the literature in several contexts. The traditional symbolic layout to physical layout translation takes the form of compaction followed by wire-length minimization, Y. Z. Liao, C. K. Wong, "An Algorithm to Compact a VLSI Symbolic Layout with Mixed Constraints", Proc. of DAC, June, 1983, pp. 107–112; and Sching L. Lin, Jonathan Allen, "Minplex—A Compactor that Minimizes the Bounding Rectangle and Individual Rectangles in a Layout", Proc. DAC, June, 1986, pp. 123–130 (incorporated herein by reference). In yield enhancement, some parts of a layout are frozen and wires are spread apart. In design migration, the problem is formulated as a minimum perturbation problem, F. L. Heng, Z. Chen, G. Tellez, "A VLSI artwork legalization technique based on a new criterion of minimum layout perturbation," in Proc. ISPD, pp. 116–121, 1997 (incorporated herein by reference). In some specific scenarios, such as electromigration reliability enhancement, a special algorithm has been developed to speed up the layout optimization process, Z. Chen, F. L. Heng, "A Fast Minimum Layout Perturbation Algorithm for Electromigration Reliability Enhancement" in Proc. International Symposium on DFT in VLSI Systems, pp. 56–63, November, 1998 (incorporated herein by reference). More recently, "altPSM" compliance layout is legalized in the same layout optimization framework, L. Liebmann and F. Heng, "Optimized phase shift migration," U.S. Pat. No. 6,083,275, July 2000; and F. Heng, L. Liebmann, and J. Lund, "Application of automated design migration to alternating phase shifted mask design," in Proc. ISPD, pp. 38–43, April, 2001 (incorporated herein by reference). All the layout optimization techniques aforementioned use a constraint graph, Y. Z. Liao, C. K. Wong, "An Algorithm to Compact a VLSI Symbolic Layout with Mixed Constraints," Proc. of DAC, June, 1983, pp. 107–112 (incorporated herein by reference), to capture the design ground rules requirement to ensure the legality of the final layout. The typical layout elements these optimization techniques operate on are shapes in library cells, shapes in small flat macros, and wires residing in one level of layout hierarchy of a large layout. Almost all the optimization scenarios are done in one level of a layout hierarchy where the problem can be solved efficiently using a graph theoretic method. Previous techniques in the hierarchical layout optimization art have focused on the hierarchical compaction problem which solves integer linear programming problems using general purpose software. These approaches, J. F. Lee, D. T. Tang, "HIMALAYAS—A Hierarchical Compaction System with a Minimized Constraint Set," Proc. ICCAD, 1992, pp. 150–157; and D. Marple, "A hierarchy preserving hierarchical compactor," Proc. 27th Design Automation Conf., pp. 375–381, 1990. (incorporated herein by reference), suffer from runtime problems with large designs.

SUMMARY OF THE INVENTION

The invention provides a hierarchical integrated circuit layout that is optimized for various manufacturing and electrical considerations in different stages of the design process. For example, with the invention, a previously completed layout can be legalized in a new set of design ground rules in a design migration process, wires of a layout can be spread apart to make use of white spaces to improve random defect yield, critical nets can be spaced farther to reduce coupling noise, and device sizes can be changed to improve performance.

An important requirement of hierarchical layout databases is that the coordinates of the layout objects must be represented in integer coordinates. The integer requirement of the layout coordinates gives rise to integer programming problems when attempting to use optimization techniques on hierarchical layouts. This invention allows the use of optimization methods while avoiding the need to solve general integer programming problems.

More specifically, the invention provides a method of modifying a hierarchical integrated circuit layout wherein the locations of hierarchical layout elements are represented with variables and formulae using these variables, which produces a formula-based hierarchical layout. These variables are constrained to be integers. The invention provides for a method for guiding the modification of the layout through an objective function defined on the same variables as the formula-based hierarchical layout. The invention simplifies the formula-based hierarchical layout by substituting constants for some of the variables, such that the each of the formulae are reduced to expressions involving no more than two remaining variables. This produces a simplified layout equation and a simplified objective function. This also produces a partial solution to the hierarchical layout modification made up of the values selected for the constants.

Then, the invention performs an optimization that minimizes or maximizes the simplified objective function subject to the constraints of the simplified hierarchical layout formulae to produce an optimized solution. The optimized solution is expected to contain only integer values for the variables. The total solution to the hierarchical layout modification is represented by the combination of the partial solution and the optimized solution. Outputting of integrated circuit modification values from the total solution produces the desired modifications to the hierarchical integrated circuit layout. The modified hierarchical integrated circuit layout includes at least some of the layout elements in different locations from the original locations and includes at least some modified layout elements.

One element of the invention is the selection of the variables that become constants and form the partial solution, and selection of the variables that go on to the optimization step. Furthermore, the fact that the formula-based hierarchical layout is limited to two-variable formulae enables the optimizer to produce the desired integer solution efficiently.

Each of the variables comprises a single dimension. The formulae are computed using algorithmic and heuristic methods. In one embodiment, all inequalities in the formulae comprise difference equations. In another embodiment, at least one of the inequalities in the formulae comprises a sum equation. A reduction step also may eliminate redundant formulae, but this is not a necessary part of the embodiment.

The optimizing process partitions cells of the hierarchical integrated circuit layout into modified cells and cells having modified placements. Initially, placement variables are assigned to represent the placement locations of the modified cells as well as the placement locations of the cells having modified placements. A partial solution step is used to determine the values of the placement variables of the modified cells. The determined values of the placement variables become constants in the partial solution. This process includes uniform scaling of the hierarchical layout, systematic scaling of the placements of the modified cells, heuristic determination of the tentative values of the placement variables of the modified cells and manual calculation of the values of the placement variables of the modified cells. The tentative values of the placement variables can be modified in subsequent iterations of the optimization process.

The present invention introduces a practical method to solve the large hierarchical problem, by reducing the large problem to a problem that can be solved efficiently using a graph theoretic technique. Since the graph theoretic technique can handle a substantially larger problem (>250 k optimizable elements), the inventive solution presents a practical approach to solve the large hierarchical layout optimization problem and the invention can be used to reduce chip size more aggressively than the simple scaling method.

BRIEF DESCRIPTION OF THE DRAWINGS

The foregoing and other objects, aspects and advantages will be better understood from the following detailed description of a preferred embodiment(s) of the invention with reference to the drawings, in which.

DETAILED DESCRIPTION OF PREFERRED EMBODIMENTS OF THE INVENTION

Hierarchical layout optimization in the context of compaction has been studied in the literature. The problem can be formulated as a general Integer Linear Programming problem (ILP). However, ILP is difficult to solve, especially for larger layouts. Indeed, ILP will only solve the hierarchical problem for small layouts with less than 250,000 optimizable entities. This conventional limitation is sometimes referred to herein as the "large hierarchical layout optimization problem." Attempts have been made to reduce the large hierarchical layout optimization problem either by minimizing the number of variables, number of constraints, or minimizing the number of general linear constraints. Since some problems are inherently large (e.g., a full chip or a large hierarchical macro) these approaches will have practical limitations when handling the large hierarchical layout optimization problems.

The present invention introduces a practical method to solve the large hierarchical problem, by reducing the large problem to a problem that can be solved efficiently using a graph theoretic technique. Since the graph theoretic technique can handle a substantially larger problem (>250 k optimizable elements), the inventive solution presents a practical approach to solve the large hierarchical layout optimization problem and the invention can be used to reduce chip size more aggressively than the simple scaling method.

Figure 1:
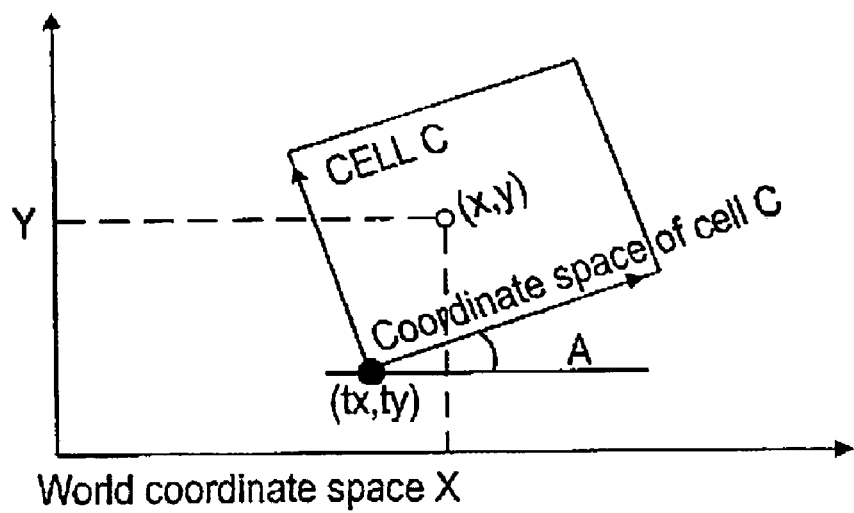
FIG. 1 is a schematic diagram showing a flat coordinate of a point (x, y)

For the purpose of this application, a layout is considered as a collection of polygons. There are distance requirements between adjacent pairs of polygon edges of the layout based on design ground rules. The set of distance requirements can be described by a set of 2-variable linear constraints. For example, as shown in FIG. 1, the minimum distance requirement, $d_{ij}$, between edge $e_i$ and edge $e_j$ can be described by the difference formula:

$$e_j(x) - e_i(x) \geq d_{ij}$$

where $e_i(x)$ and $e_j(x)$ are edge variables denoting the positions of the edges. The maximum distance requirement, $D_{ij}$, between the edges can be described by the formula:

$$e_j(x) - e_i(x) \leq D_{ij}$$

It is well known in the literature, that this set of 2-variable difference formulae form a constraint graph which describes the design ground rule requirements of the corresponding layout. Depending on the objective function for the layout optimization problem, the solution can be obtained by using very efficient graph theoretic algorithms. For example, to get minimum area, the problem can be solved by using a longest path algorithm. The longest path algorithm locates edges at their smallest location, in order, resulting in a minimum area solution. The ordering that is followed by this computation is extracted by analysis of the constraint graph.

To get minimum critical area and minimum layout perturbation, the problem can be solved using an optimization algorithm that minimizes a piece-wise linear objective function subject to 2-variable difference constraint formulae. A constraint graph is a convenient form for representing the 2-variable formulae, and the graph-based simplex algorithm is a specialized optimization algorithm that solves this optimization problem. The current known art uses these formulations for flat (e.g., non-hierarchical) layouts or for a layouts in which all the optimizable layout elements (polygons and other nested cells) reside in the same cell in the layout hierarchy.

In practice, large layouts such as cores or large macros are described hierarchically for data volume efficiency. Geometries in a cell are defined once and can be instantiated or referenced many times. When a cell is referenced, the absolute coordinates of the geometries defined in the cell are computed by applying the reference transformation. For example, when a cell C is instantiated by a transformation T(tx, ty, A, m), where, m: 1 if the cell is mirrored along the x-axis, 0 otherwise A: angle to rotate the cell about the origin tx, ty: translation factors in the X and Y direction respectively, the flat coordinate (X, Y) of a point (x, y) in cell C, i.e. the coordinate of (x, y) in the root cell, is given by $$(X, Y) = T(tx, ty, A, m) o (x, y)$$

and, $$X = x \cos(A) - (1-2m) y \sin(A) + tx$$

$$Y = x \sin(A) + (1-2m) y \cos(A) + ty$$

In a hierarchical layout, a cell can be referenced within another cell which in turned can be referenced by another cell. In most designs, the angle A is a multiple of 90 degrees. Therefore, when $\cos(A)$ is $\pm 1$, $\sin(A)$ is 0, when $\sin(A)$ is $\pm 1$, $\cos(A)$ is 0. When A is a multiple of 90 degrees, there are exactly 8 mirror and rotation combinations of m and A. Thus, let Aa__Mm denote the mirror rotation when the angle of rotation is a and the mirroring is m. The 8 combinations are: A0__M0, A90__M0, A180__M0, A270__M0, A 0__M1, A90__M1, A180__M1, A270__M1. In general, if a cell C is instantiated through a series of transformations, $T_n, \ldots, T_1$, where, $T_i = T(tx_i, ty_i, A_i, m_i)$, the absolute coordinate (X, Y) of a point (x, y) in C is given by $$(X, Y) = T_n o T_{n-1} \ldots o T_1 o (x, y)$$

$T_n o T_{n-1} \ldots o T_1$ is called the instance path, for this instance of C.

The flat edge $E_i$ is an edge $e_i$ of a cell C, for a given instance of C, described in the coordinate space of the root cell, i.e. $E_i$ is $e_i$ described in the world coordinate.

Figure 2:
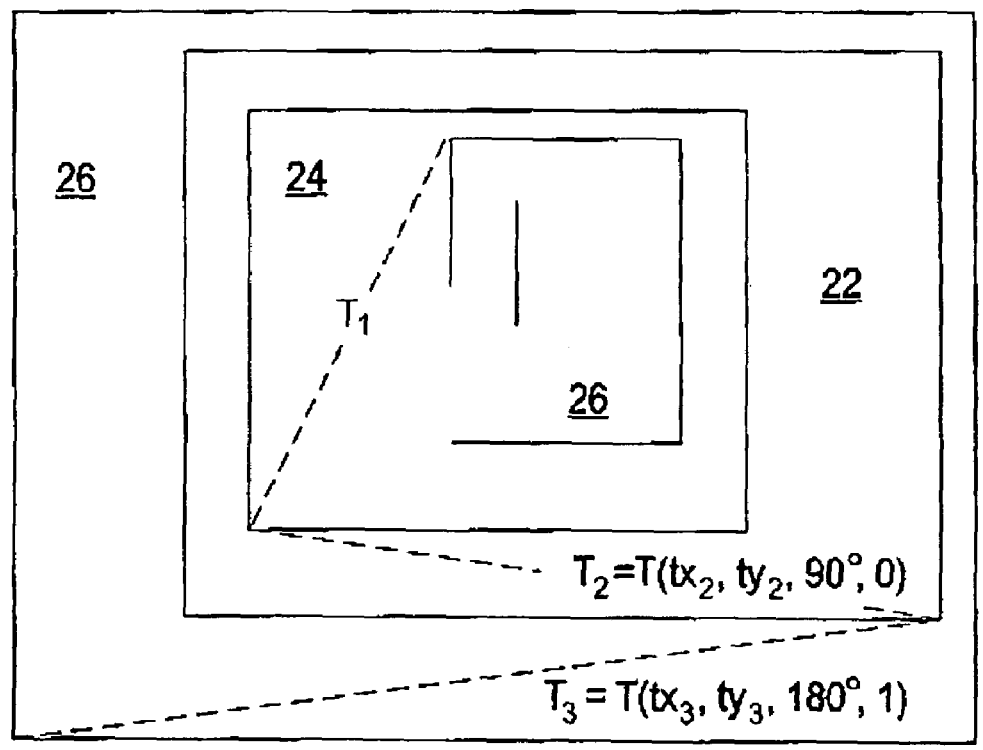
FIG. 2 is a schematic diagram showing a flat edge in a hierarchical layout.

Consider the example in FIG. 2. In the 4-level hierarchy shown in FIG. 2, cell 20 is transformed into cell 22 using $T_1 = T(tx_1, ty_1, 90°, 0)$. Similarly, cell 22 is transformed into cell 24 using $T_2 = T(tx_2, ty_2, 90°, 0)$ and cell 24 is transformed into cell 26 using $T_3 = T(tx_3, ty_3, 180°, 1)$. Let $e_i(x)$: denotes an edge variable denotes the x-coordinate of $e_i$ in the cell C, $E_i(x)$: denotes the x-coordinate of the flat $E_i$ in the world coordinate, and $t_2(x), t_3(x), t_1(y)$: denote placement variables denote the x-coordinate of the translation factors $tx_2$, $tx_3$, $ty_1$ Then, $$E_i(x) = t_3(x) - t_2(x) + t_1(y) + e_i(x).$$

The location of $E_i$, $E_i(x)$ is expressed as a formula comprises the placement variables, $t_3(x), t_2(x), t_1(y)$ and the edge variable $e_i(x)$. In general, the x-coordinate of a flat edge $E_i$ of an edge $e_i$ with an instance path $T_n o T_{n-1} \ldots o T_1$, when $E_i$ and $e_i$ have the same orientation is given by:

$$E_i(x, T_n \circ T_{n-1} \ldots T_1) = \sum_{j=1}^{n} s_j t_j(\tau) + s_0 e_i(x)$$

where, $s_j$: 1 or $-1$ depending on the combination of A and m. $S_0$ is 1 when the mirror-rotation of $T_1$ is A0__M0, A0__M1, $-1$ when mirror-rotation of $T_1$ is A180__M0, A 180__M1, and $t_j(\tau)$: one of placement variable $t_j(x)$ or $t_j(y)$ depending on the combination of A and m.

When $E_i$ and $e_i$ have different orientation, $$E_i(x, T_n \circ T_{n-1} \ldots T_1) = \sum_{j=1}^{n} s_j t_j(\tau) + s_0 e_i(y)$$

In this case, $s_0$ is 1 when the mirror-rotation of $T_1$ is A270__M0, A90__M1, $-1$ when the mirror-rotation of $T_1$ is A90__M0, A270__M1. The design ground rule requirements between a pair of flat edges, $E_i$ is the flat edge of an edge $e_i$ with instance path $T_{in} o T_{i(n-1)} o \ldots o T_{i1}$ and $E_j$ is the flat edge $e_j$ with instance path $T_{jm} o T_{j(m-1)} o \ldots o T_{j1}$ can then be represented by a formula of the form $$E_j(x, T_{jm} o T_{j(m-1)} o \ldots o T_{j1}) - E_i(x, T_{in} o T_{i(n-1)} o \ldots o T_{i1}) \geq d_{ij}$$

Figure 3:
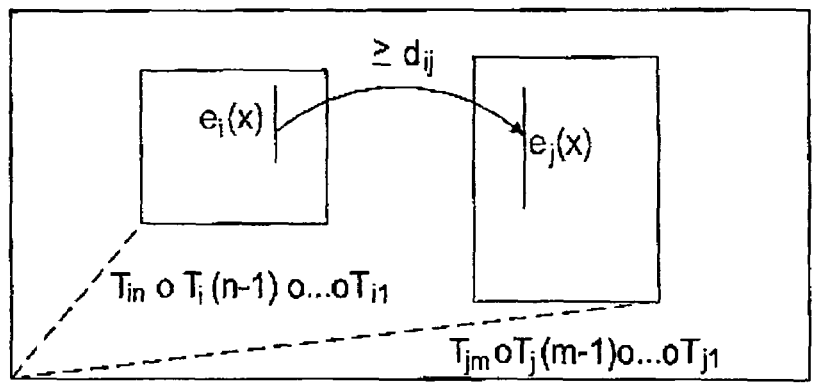
FIG. 3 is a schematic diagram showing a hierarchical constraint.

Or equivalently, $$s_{j0} e_j(x) - s_{i0} e_i(x) + \sum_{k=1}^{m} s_{jk} t_{jk}(\tau) - \sum_{l=1}^{n} s_{il} t_{il}(\tau) \geq d_{ij}$$

as shown in FIG. 3. Thus, FIG. 3 illustrates the hierarchical constraint formula between the two flat edges $E_i$ and $E_j$. The variables in a hierarchical constraint formula are the placement variables from each transformation of the two instance paths, and the edge variables $e_i(x)$ and $e_j(x)$.

After the complete set of hierarchical formulae are constructed to represent the ground rules requirements of a hierarchical layout, with an appropriate optimization objective function, the problem can be solved as an integer linear programming problem (ILP). In general, there is no efficient way to solve an ILP when the problem size is large (e.g., the large hierarchical layout optimization problem). This makes the formulation an impractical solution for larger hierarchical designs. The invention introduces a practical method to reduce the large hierarchical layout optimization problem into a two-variable form that can be solved efficiently.

The invention separates the ILP problem into two distinct steps and iterates between the two steps if necessary. The first step is to produce a partial solution by pre-determining tentative values of the placement variables corresponding to the translation factors of the transformations in the hierarchical layout. The second step uses the predetermined values of the placement variables as constants and solves the remaining optimization problem using efficient non-integer techniques which will produce an integer solution. The tentative values of the placement variables can be revised after the second step, better solutions can then be obtained through subsequent iteration of the first and second steps.

In the first step, the tentative values of the placement variables can be determined by one or all of the following methods: (1) uniform scaling of the translation factors, (2) systematic scaling of the translation factors, (3) heuristic determination of the translation factors, and (4) manual calculation of the values through layout methodology.

An example of uniform scaling occurs when all the data is scaled uniformly, i.e., the translation factors as well as all the geometries of the layout are scaled by the same scale factor. Note that the complete set of hierarchical formulae is constructed before the scaling process. The scaling process does not actually scale the layout, it is only a computation process to find tentative values of the placement variables. The placement variables which correspond to the translation factors attain the values of the scaled translation factors. This represents a large class of layout optimization problems in which the global layout structure remains unchanged with respect to the scaled ratio but minimal adjustments are needed to reflect new design ground rule requirements. This example includes the identity scaling in which all transforms remain unchanged, but layout geometries need to be modified to reflect new ground rule requirements.

Figure 4:
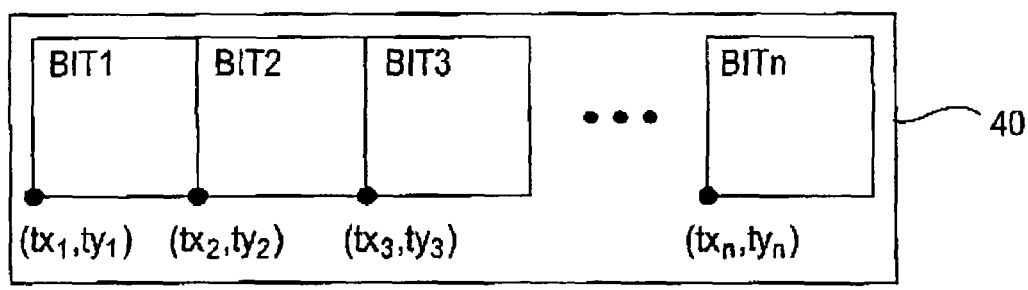
FIG. 4 is a schematic diagram showing a recomputing translation factors of a data-flow macro.
Figure 4:
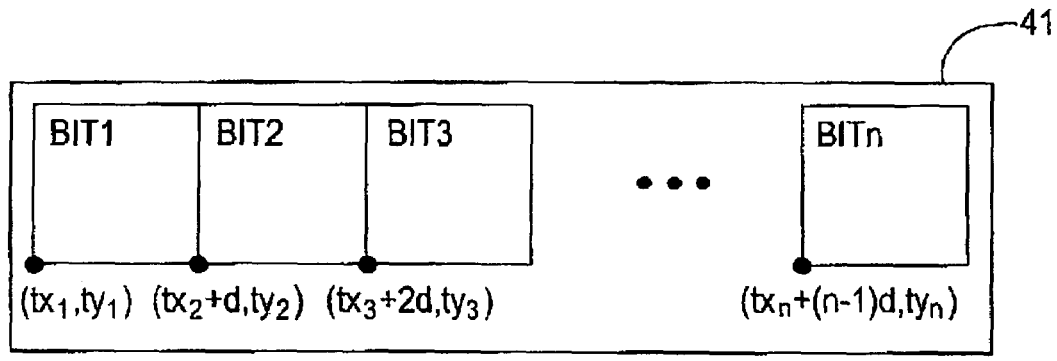

Another example of uniform scaling occurs when the translation factors are scaled at different scale factors than the layout geometries. For example, in a data-flow macro which consists of bit cells with equal width, due to design methodology changes, each cell may need to be expanded by a given width, but the dimensions of geometries in the cells remain unchanged. In this case, the location of each bit cell can be precomputed with a uniform scale factor, as shown in FIG. 4. More specifically, FIG. 4 illustrates a data-flow macro before and after hierarchical modification. Item 40 represents the data-flow before hierarchical modification and item 41 represents the data-flow macro after hierarchical modification. Item 41 is modified by using precomputed translation factors. More specifically each of the data units BIT1, BIT2, etc. grows by d units using a translation factor $(tx_i+(i-1)d)$. The corresponding placement variable $t_i(x)$ then attains the scaled value of $(tx_i+(i-1)d)$. Uniform scaling of an array is also handled in a similar fashion.

Figure 5:
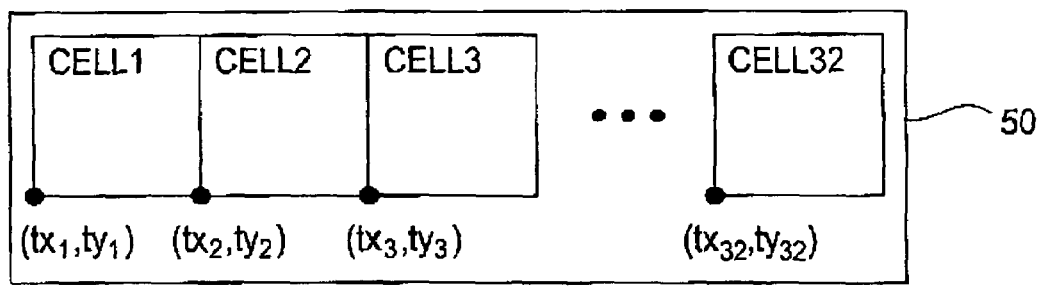
FIG. 5 is a schematic diagram showing precomputing translation factors of a row of cells.
Figure 5:
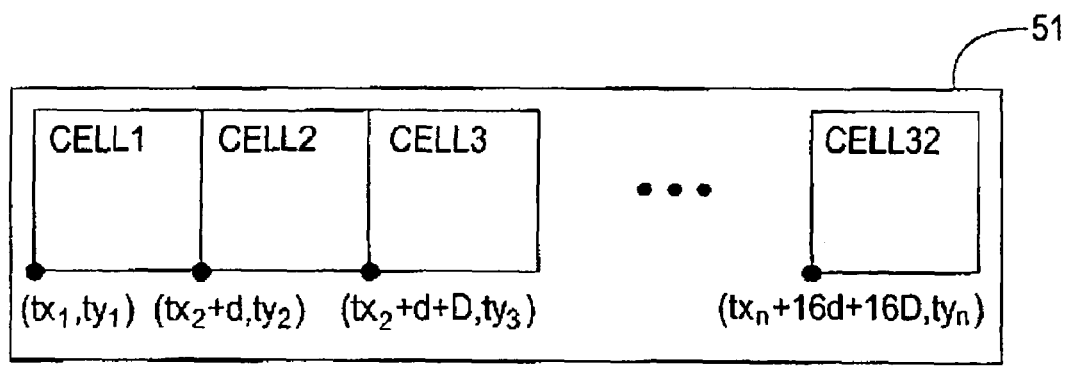

An example of a systematic scaling is when cells of a hierarchical layout are scaled at different scale factors due to different design requirements. With the invention, the positions of each cell can be precomputed and set to the precomputed positions. As an illustration, consider a layout with a row of cells, where the odd number cells remain the same size and the even number cells shrink by 70%. Again, the positions of each cell can be precomputed. For example, FIG. 5 illustrates a data-flow macro before and after hierarchical modification. Item 50 represents the data-flow before hierarchical modification and item 51 represents the data-flow macro after hierarchical modification. Item 51 is modified by using precomputed translation factors. More specifically, each of the even data units CELL2, CELL4, etc. grows by d units using a translation factor $(tx_i+d, ty_2)$ and each of the odd data units CELL1, CELL3, etc., grows by D units using a transition factor $(tx_i+d+D, ty_2)$. The i-th translation factor is represented as $((tx_i+\text{floor}(i/2)d)+\text{floor}((i-1)/2)D, ty_n)$ which indicates that the odd number of cells grows by d units and the even number of cells grows by D units. The corresponding placement variable $t_i(x)$ then attain the value $(tx_i+\text{floor}(i/2)d)+\text{floor}((i-1)/2)D)$.

An example of a heuristic determination of the translation factors is done by estimating the final size of each cell. The estimated cell sizes can then be used to pre-compute the location of the cells in the hierarchy by reassembling the cells in the layout with the new sizes. The placement variables then attain the predetermined values of the corresponding translation factors to form a partial solution. After the second step (described later), more accurate values can be obtained with more accurate estimates of the cell sizes.

The partial solution can also be constructed by manual computation of the final values of the placement variables. This can occur when final values of the translation factors can be determined apriori based on layout methodology. For example, a layout methodology may dictate the final size of each cell. The cell size can then be used to compute the value of the translation factors and thus, the values of the corresponding placement variables.

In the second step of the invention, the placement variables in the hierarchical formulae are replaced with their pre-determined values obtained from the first step. As discussed above with respect to FIG. 3, a hierarchical constraint formula between a pair of flat edges, $E_i$ and $E_j$ is given by $$E_j(x, T_{jm}oT_{j(m-1)}o \ldots oT_{j1})-E_i(x, T_{in}oT_{i(n-1)}o \ldots oT_{i1}) \geq d_{ij}$$

i.e., $$s_{j0}e_j(x) - s_{i0}e_i(x) + \sum_{k=1}^{m} s_{jk}t_{jk}(\tau) - \sum_{l=1}^{n} s_{il}t_{il}(\tau) \geq d_{ij}$$

After all the values of placement variables $t_{jk}(\tau)$, $t_{i1}(\tau)$ have been determined, the hierarchical constraint formula becomes $$s_{j0}e_j(x) - s_{i0}e_i(x) \geq d_{ij} + \text{constant}$$

The values of $s_{j0}$ and $s_{i0}$ are either 1 or $-1$. When $s_{j0}=s_{i0}$, the constraint is reduced to a simple 2-variable difference constraint. If $s_{j0}=s_{i0}$ for all hierarchical constraints, the hierarchical layout optimization problem has been reduced to a simple 2-variable constraint set as in the flat layout optimization discussed above. The same graph based solution can then be applied to solve the optimization problem. When $s_{j0} \neq s_{i0}$, the constraint is reduced to a simple 2-variable sum constraint formula of the form $$e_j(x)+e_i(x) \geq d_{ij} + \text{constant}$$

Or $$e_j(x)+e_i(x) \leq d_{ij} + \text{constant}$$

In the case when there is an inherent sum constraints formula subset (i.e., the formulae cannot be re-written into difference formula), the invention utilizes a graph theoretic algorithm which can handle large numbers of variables and constraints without having to resort to the expensive ILP (which is not practical for large problems). As is known to those ordinarily skilled in the art, existing graph based simplex algorithms can only be used to solve the problem when all 2-variable formulae are difference formulae (subtraction operations). However, the invention can operate with both difference and sum formulae utilizing this graph theoretic algorithm. See the unpublished paper by Lvov entitled "A Graph Based Simplex Method for the Integer Minimum Perturbation Problem with Sum and Difference Constraints" (the complete disclosure of which is incorporated herein by reference) which is attached hereto as Appendix A for a more detail description of the graph theoretic algorithm.

It is known in the art that the basic operation of a graph based simplex method to solve a system of difference formulae is the pivoting operation. A pivoting operation moves a basic solution to the next basic solution and improves the objective function in each move. In the case when all formulae are difference formulae, each basic solution is represented by a tree structure known as tight-arc-tree. One important element in the algorithm that is described in Appendix A is the discovery of a basic structure which represents a basic solution when the formulae comprise both sum and difference formulae. The discovery of this structure allows the pivoting operation to move from one basic solution to the next in a very efficient manner without resorting to a general ILP technique.

Another important element of the algorithm described in Appendix A is a rounding method that rounds a non-integer solution obtained when solving the system of sum and difference formulae to an integer solution. The method is guaranteed to find a near-optimal rounding if one exists, in a computationally efficient manner. The rounding method is independent of the graph based pivoting method described in Appendix A. It can be used to obtain a near-optimal rounding for a non-integer solution obtained by any other means. For example, the system of sum and difference formulae can also be solved using known Linear Programming (LP) package with efficient implementation.

After the optimization step, more accurate cell sizes are obtained. With the more accurate cell sizes, more accurate values for the placement variables can be obtained, and thus, a better partial solution can be obtained. Better solutions can then be obtained by iterating through the first and second step of the solution process until no further improvement can be made or until a pre-set iteration limit is reached.

When an instance of a cell C is referred to herein as being x-oriented, this describes that the vertical edges of the shapes in C are vertical in the world coordinate. When an instance of a cell C is described as being y-oriented, the vertical edges of the shapes in C become horizontal in the world coordinate. If a cell C has both x-oriented and y-oriented instances, a copy of the cell C is created such that all x-oriented instances use the original cell C and all y-oriented instances use the cloned cell. This creation of cloned cells of a hierarchical layout is called normalization, which will allow the layout optimization to be done one direction at a time. In practice, instances of a cell are either all x-oriented or all y-oriented almost all of the time.

If normalization is required, a subsequent optimization step is performed to force the cloned cells and their parent cells to be identical. After the cloned cells and the parent cells are converged, the original layout hierarchy is restored.

As an alternative to strictly requiring all translation factors to be pre-computed, some cells may be selected to be movable, while the contents of all edges and transforms in the cell (either directly or through transforms) are determined using the above scaling techniques. This is useful if the desired location of all contents of a cell can be correctly determined by scaling, as might be the case with a via cell used in wiring. Therefore, the invention does not need to change all placement variable into constants and, instead the invention may only replace the placement variables that are computationally difficult with constants and allow placement variables that are relatively simple to remain. This allows the invention to decrease the complexity of the calculation without sacrificing as much accuracy.

In this case, the following formulae for a constraint involves a flat edge $E_j$ contained in a movable cell with transform $t_v$ and a flat edge $E_i$ whose nested edge $e_i$ is movable:

$$E_j(x, T_{jm}oT_{j(m-1)}o \ldots oT_{j1}) - \\ E_i(x, T_{in}oT_{i(n-1)}o._{j1} \ldots oT_{i1}) = \sum_{k=1}^{m} s_{jk}t_{jk}(\tau) + s_{j0}e_j(x) - \\ \left(\sum_{l=1}^{n} s_{il}t_{il}(\tau) + s_{i0}e_i(x)\right) \\ = s_{j0}e_j(x) - s_{i0}e_i(x) + \\ \sum_{k=1}^{m} s_{jk}t_{jk}(\tau) - \sum_{l=1}^{n} s_{il}t_{il}(\tau)$$

-continued $$= s_{j0}e_j(x) - s_{i0}e_i(x) + \sum_{k=1}^{v-1} s_{jk}t_{jk}(\tau) + \\ s_{jv}t_{jv}(\tau) \sum_{k=v+1}^{m} s_{jk}t_{jk}(\tau) - \sum_{l=1}^{n} s_{il}t_{il}(\tau) \\ = s_{i0}e_i(x) + s_{j0}e_j(x) \sum_{k=1}^{v-1} s_{jk}t_{jk}(\tau) + \\ \sum_{k=v+1}^{m} s_{jk}t_{jk}(\tau) - \sum_{l=1}^{n} s_{il}t_{il}(\tau)$$

In this case, if all placement variables except $t_{jv}(\tau)$ have been determined and $e_j(x)$ is also determined, then the constraint reduces to:

$$s_{jv}t_{jv} - s_{i0}e_i(x) \geq d_{ij} + \text{constant}$$

The reduction is also valid if $e_i(x)$ is determined and there is a unique $t_{iu}(\tau)$ which remains as a variable.

Thus, the invention permits a transform location to be a variable if the location of all transforms and edges contained within its defining cell are determined, and if all transforms leading to a use of the cell containing the variable transform are determined.

One way of confirming that a transform may be treated as a variable is to designate certain cells as via cells. A via cell may contain shapes and transforms to other designated via cells. The location of both edges and transforms in via cells must be pre-determined by scaling or other techniques described above. If this is done, transforms to via cells that are located in non-via cells may only be treated as variables in constraints. If this rule is followed, then any constraints discovered will have two variables, representing the location of either edges or transforms to via cells located in non-via cells.

In another embodiment of this invention, it is possible to optimize the layout shapes and transforms within single or multiple cells that are unrelated by hierarchy, while satisfying the requirements of the layout hierarchies in which these cells are used. To accomplish this, the invention selects a set of cells, so-called flexible cells, such that their instance paths in the design hierarchy does not contain any other flexible cells. Next, the invention treats as via cells all cells that are transformed into flexible cells. Also treated as via cells are any cells transformed within another via cell. Additionally, any cell containing a transform to a flexible cell is called an overlay. If a cell contains a transform to an overlay cell, its also called an overlay.

Having tagged some of the cells as flexible cells, the edges and transforms in the overlay cells are selected to be unmovable. The via cells, edges of shapes in via cells, and transforms from flexible cells to via cells are treated as described before. Finally, edges of shapes in flexible cells are allowed to be optimized.

Following the hierarchical constraint equations, and simplifying them as described above, the result of this embodiment of the invention is a set of two variable constraints, that can be used to optimize a set of cells within their hierarchical context in a layout.

Figure 6:
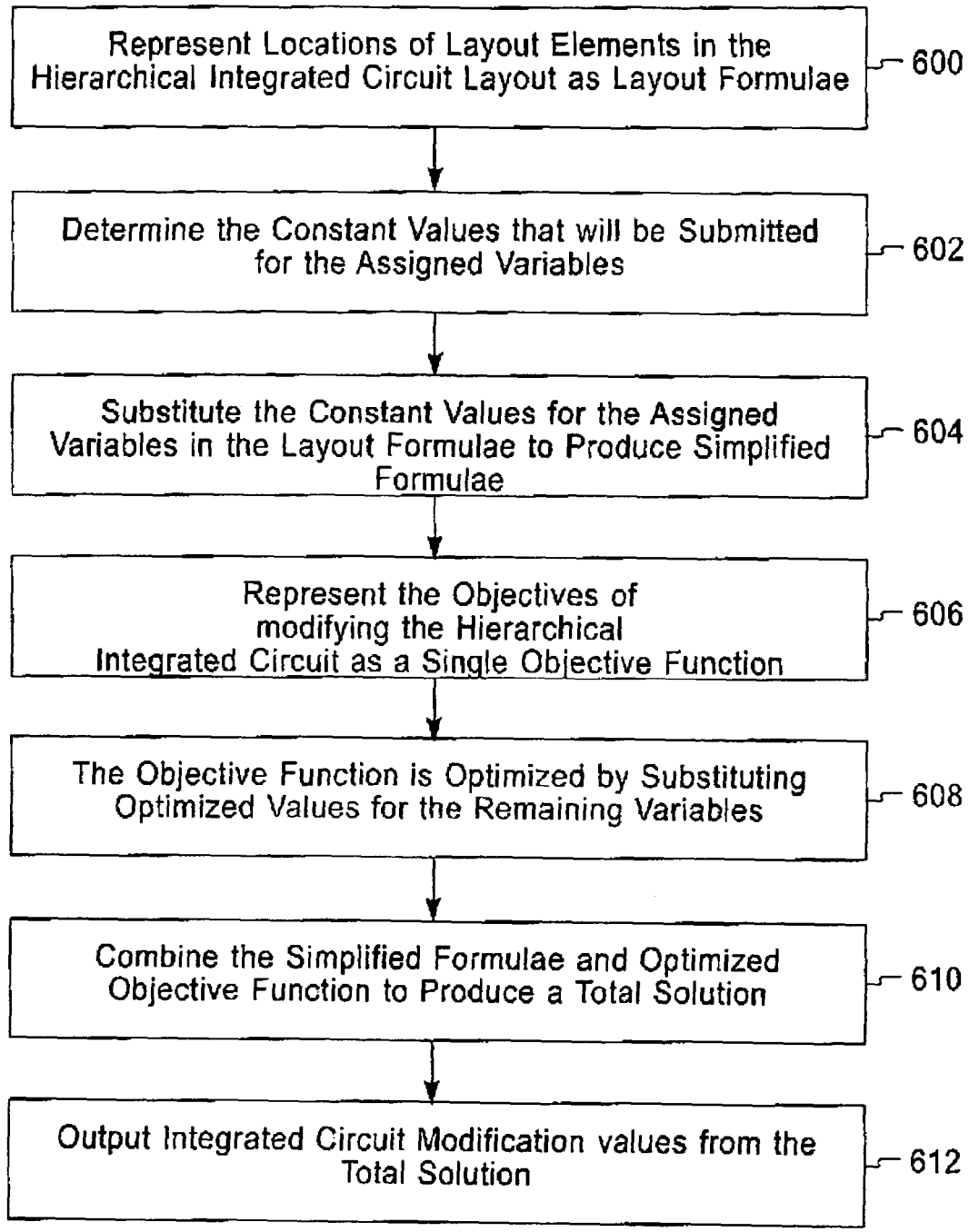
FIG. 6 is a flowchart showing the operation of one embodiment of the invention.

FIG. 6 shows the invention in flowchart form. As shown in FIG. 6, the invention provides a method of modifying a hierarchical integrated circuit layout to satisfy objectives. The method first represents locations of layout elements in the hierarchical integrated circuit layout as layout formulae

600. The layout formulae have layout variables. This produces a formula-based hierarchical layout (as distinguished from a non-hierarchical formula-based layout). Each of the layout variables represents a location of a given layout element in a single dimension (e.g., X or Y dimension). With the invention, all inequalities in the layout formulae comprise difference equations or at least one of the simplified formulae can have a two-variable sum inequality expression.

Next, the invention determines the constant values that will be substituted for the assigned variables 602. This produces a partial solution to the layout formulae. The assigned variables will be replaced with constants while the remaining variables in the layout formulae will not. The constants are determined using one or more of algorithmic and heuristic methods consistent with the objectives, a uniform and systematic scaling operation consistent with the objectives, and estimating the constant values based on an estimated size change of the layout elements consistent with the objectives.

In item 604, the invention substitutes the constant values for the assigned variables in the layout formulae to produce simplified formulae from the layout formulae. This can also include eliminating redundant formulae. After the substitutions, each of the simplified formulae contains no more than two remaining layout variables.

The invention then represents the objectives of modifying the hierarchical integrated circuit layout as a single objective function 606 using one or more of the remaining variables. More specifically, this process includes representing the objectives as a total objective function using the layout variables and simplifying the total objective function by substituting the constant values for the assigned variables, to produce the objective function.

An optimizing process 608 follows where the objective function is optimized by substituting optimized values for the remaining variables in the objective function. The optimized values minimize or maximize the result produced by the objective function. The optimized values also must be legal values. Legal values are values that, when substituted for the remaining values in the simplified formulae, obey inequality restrictions in the simplified formulae. During the optimizing process, the invention can also partition cells of the hierarchical integrated circuit layout into modifiable cells and cells having modifiable placements. Further, the optimization process can comprise any one an efficient graph based method, linear programming method, and a rounding method.

In one iterative processing option, the invention can repeat processes 602–608 until the result produced by the objective function either stops increasing or stops decreasing (indicating that the objective function is no longer being further optimized). In addition (or alternatively), the iterations are limited to a predetermined number of repetitions.

The invention then combines the simplified formulae and the optimized objective function to produce a total solution 610. The total solution consists of the assignments to variables from both solutions. Because the variables assigned in the optimized solution in step 608 consist exactly of the variables not assigned by the partial solution in step 602, and the simplified formulae are consistent with the solution to the partial solution, the combined assignments are a solution to the original layout formulae defined in step 600.

In item 612, the invention outputs integrated circuit modification values from the total solution, wherein the modification values are used to produce a modified hierarchical integrated circuit layout. For example, if variable e, denotes the x-coordinate of edge i in cell C, and the solution assigns the value $x_i$ to variable $e_i$, then the x-coordinate of edge i must be modified to have x-coordinate $x_i$. Similarly, the translation factors of transforms must be modified to reflect the solutions to variables representing their locations.

The optimizing process partitions cells of the hierarchical integrated circuit layout into modified cells and cells having modified placements. The modified hierarchical integrated circuit layout includes at least some of the layout elements in different locations from the original locations and includes at least some modified layout elements. As explained above, in one embodiment, all inequalities in the formulae comprise difference equations. In another embodiment, at least one of the inequalities in the formulae comprises a sum equation.

Figure 7:
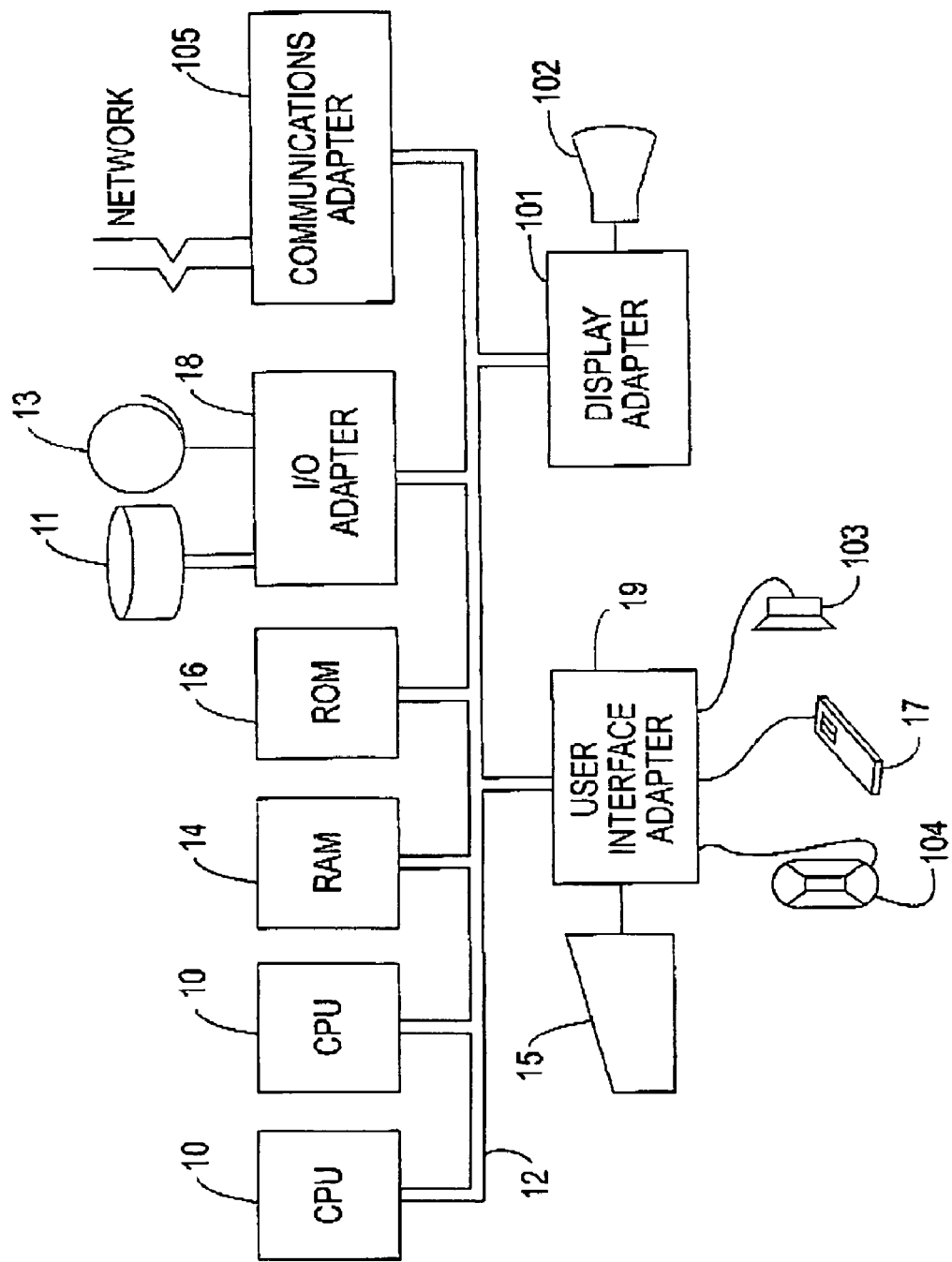
FIG. 7 is a hardware embodiment of the invention.

A representative hardware environment for practicing the present invention is depicted in FIG. 7, which illustrates a typical hardware configuration of an information handling/computer system in accordance with the subject invention, having at least one processor or central processing unit (CPU) 10. CPUs 10 are interconnected via system bus 12 to random access memory (RAM) 14, read-only memory (ROM) 16, an input/output (I/O) adapter 18 for connecting peripheral devices, such as disk units 11 and tape drives 13, to bus 12, user interface adapter 19 for connecting keyboard 15, mouse 17, speaker 103, microphone 104, and/or other user interface devices such as touch screen device (not shown) to bus 12, communication adapter 105 for connecting the information handling system to a data processing network, and display adapter 101 for connecting bus 12 to display device 102. A program storage device readable by the disk or tape units, is used to load the instructions which operate the invention also loaded onto the computer system.

The present invention introduces a practical method to solve the large hierarchical problem, by reducing the large problem to a problem that can be solved efficiently using a graph theoretic technique. Since the graph theoretic technique can handle a substantially larger problem (>250 k optimizable elements), the inventive solution presents a practical approach to solve the large hierarchical layout optimization problem and the invention can be used to reduce chip size more aggressively than the simple scaling method.

This method is applied to a complete design by identifying multiple independent sets of flexible cells, and then applying the layout optimization activities for each of these sets. Note that each optimization is done within the hierarchical context of the cells, thus cross hierarchy constraints are honored without need for additional work.

While the invention has been described in terms of preferred embodiments, those skilled in the art will recognize that the invention can be practiced with modification within the spirit and scope of the appended claims.

What is claimed is:

1. A method of modifying a hierarchical integrated circuit layout to satisfy objectives, said method comprising:

representing locations of layout elements in said hierarchical integrated circuit layout as layout formulae having layout variables to produce a formula-based hierarchical layout, wherein each of said layout variables represents a location of a given layout element in a single dimension;

determining constant values to be substituted for assigned variables of said layout variables to produce a partial solution to said layout formulae;

substituting said constant values for said assigned variables in said layout formulae to produce simplified formulae from said layout formulae, wherein after said substituting process each of said simplified formulae contains no more than two remaining variables of said layout variables;

representing said objectives as a single objective function using at least one of said remaining variables;

optimizing said objective function by substituting optimized values for said remaining variables in said objective function to produce an optimized objective function, wherein said optimized values one of minimize and maximize a result of said objective function, and wherein said optimized values comprise legal values that, when substituted for said remaining values in said simplified formulae, obey inequality restrictions in said simplified formulae;

combining said simplified formulae and said optimized objective function to produce a total solution; and outputting integrated circuit modification values from said total solution, wherein said modification values are used to produce a modified hierarchical integrated circuit layout.

2. The method in claim 1, wherein said representing of said objectives as said single objective function comprises:

representing said objectives as a total objective function using said layout variables; and simplifying said total objective function by substituting said constant values for said assigned variables, to produce said objective function.

3. The method in claim 1, wherein said determining of said constant values comprises using one or more of:

algorithmic and heuristic methods consistent with said objectives;

a uniform and systematic scaling operation consistent with said objectives; and estimating said constant values based on an estimated size change of said layout elements consistent with said objectives.

4. The method in claim 1, wherein said wherein said substituting process includes eliminating redundant formulae.

5. The method in claim 1, wherein said optimizing process further comprises partitioning cells of the hierarchical integrated circuit layout into modifiable cells and cells having modifiable placements.

6. The method of claim 1, wherein said optimizing process comprises one of an efficient graph based method, a linear programming method, and a rounding method.

7. The method in claim 1, wherein all inequalities in said layout formulae comprise difference equations.

8. The method of claim 1, wherein at least one of said simplified formulae comprises a two-variable sum inequality expression.

9. A method of modifying a hierarchical integrated circuit layout to satisfy objectives, said method comprising:

representing locations of layout elements in said hierarchical integrated circuit layout as layout formulae having layout variables to produce a formula-based hierarchical layout, wherein each of said layout variables represents a location of a given layout element in a single dimension;

determining constant values to be substituted for assigned variables of said layout variables to produce a partial solution to said layout formulae;

substituting said constant values for said assigned variables in said layout formulae to produce simplified formulae from said layout formulae, wherein after said substituting process each of said simplified formulae contains no more than two remaining variables of said layout variables;

representing said objectives as single objective function using at least one of said remaining variables;

optimizing said objective function by substituting optimized values for said remaining variables in said objective function to produce an optimized objective function, wherein said optimized values one of minimize and maximize a result produced by said objective function, and wherein said optimized values comprise legal values that, when substituted for said remaining values in said simplified formulae, obey inequality restrictions in said simplified formulae;

repeating said determining, said substituting, said representing, and said optimizing processes until said result one of stops increasing and stops decreasing;

combining said simplified formulae and said optimized objective function to produce a total solution; and outputting integrated circuit modification values from said total solution, wherein said modification values are used to produce a modified hierarchical integrated circuit layout.

10. The method in claim 9, wherein said repeating is limited to a predetermined number repetitions.

11. The method in claim 9, wherein said representing of said objectives as said single objective function comprises:

representing said objectives as a total objective function using said layout variables; and simplifying said total objective function by substituting said constant values for said assigned variables, to produce said objective function.

12. The method in claim 9, wherein said determining of said constant values comprises using one or more of:

algorithmic and heuristic methods consistent with said objectives;

a uniform and systematic scaling operation consistent with said objectives; and estimating said constant values based on an estimated size change of said layout elements consistent with said objectives.

13. The method in claim 9, wherein said wherein said substituting process includes eliminating redundant formulae.

14. The method in claim 9, wherein said optimizing process further comprises partitioning cells of the hierarchical integrated circuit layout into modifiable cells and cells having modifiable placements.

15. The method of claim 9, wherein said optimizing process comprises one of an efficient graph based method and a linear programming method.

16. The method of claim 9, wherein said optimizing process further comprises rounding said solution result to a near optimum integer solution, using an efficient rounding method.

17. The method in claim 9, wherein all inequalities in said layout formulae comprise difference equations.

18. The method of claim 9, wherein at least one of said simplified formulae comprises a two-variable sum inequality expression.

19. A method of modifying a hierarchical integrated circuit layout to satisfy objectives, said method comprising:

representing locations of layout elements in said hierarchical integrated circuit layout as layout formulae having layout variables to produce a formula-based hierarchical layout, wherein each of said layout variables represents a location of a given layout element in a single dimension;

determining constant values to be substituted for assigned variables of said layout variables to produce a partial solution to said layout formulae;

substituting said constant values for said assigned variables in said layout formulae to produce simplified formulae from said layout formulae, wherein after said substituting process each of said simplified formulae contains no more than two remaining variables of said layout variables;

representing said objectives as a single objective function using at least one of said remaining variables; and optimizing said objective function by substituting optimized values for said remaining variables in said objective function to produce an optimized objective function, wherein said optimized values one of minimize and maximize a result of said objective function, and wherein said optimized values comprise legal values that, when substituted for said remaining values in said simplified formulae, obey inequality restrictions in said simplified formulae.

20. The method in claim 19, wherein said representing of said objectives as said single objective function comprises:
representing said objectives as a total objective function using said layout variables; and
simplifying said total objective function by substituting said constant values for said assigned variables, to produce said objective function.

21. The method in claim 19, wherein said determining of said constant values comprises using one or more of:
algorithmic and heuristic methods consistent with said objectives;
a uniform and systematic scaling operation consistent with said objectives; and
estimating said constant values based on an estimated size change of said layout elements consistent with said objectives.

22. The method in claim 19, wherein said wherein said substituting process includes eliminating redundant formulae.

23. The method in claim 19, wherein said optimizing process further comprises partitioning cells of the hierarchical integrated circuit layout into modifiable cells and cells having modifiable placements.

24. The method of claim 19, wherein said optimizing process comprises one of an efficient graph based method, a linear programming method, and a rounding method.

25. The method of claim 19, wherein said optimizing process further comprises rounding said solution result to a near optimum integer solution, using an efficient rounding method.

26. The method in claim 19, wherein all inequalities in said layout formulae comprise difference equations.

27. The method of claim 19, wherein at least one of said simplified formulae comprises a two-variable sum inequality expression.

28. A program storage device readable by machine tangibly embodying a program of instruction executable by said machine for performing a method of modifying a hierarchical integrated circuit layout to satisfy objectives, said method comprising:
representing locations of layout elements in said hierarchical integrated circuit layout as layout formulae having layout variables to produce a formula-based hierarchical layout, wherein each of said layout variables represents a location of a given layout element in a single dimension;

determining constant values to be substituted for assigned variables of said layout variables to produce a partial solution to said layout formulae;

substituting said constant values for said assigned variables in said layout formulae to produce simplified formulae from said layout formulae, wherein after said substituting process each of said simplified formulae contains no more than two remaining variables of said layout variables;

representing said objectives as a single objective function using at least one of said remaining variables;

optimizing said objective function by substituting optimized values for said remaining variables in said objective function to produce an optimized objective function, wherein said optimized values one of minimize and maximize a result of said objective function, and wherein said optimized values comprise legal values that, when substituted for said remaining values in said simplified formulae, obey inequality restrictions in said simplified formulae;

combining said simplified formulae and said optimized objective function to produce a total solution; and outputting integrated circuit modification values from said total solution, wherein said modification values are used to produce a modified hierarchical integrated circuit layout.

29. The program storage device in claim 28, wherein said representing of said objectives as said single objective function comprises:
representing said objectives as a total objective function using said layout variables; and
simplifying said total objective function by substituting said constant values for said assigned variables, to produce said objective function.

30. The program storage device in claim 28, wherein said determining of said constant values comprises using one or more of:
algorithmic and heuristic methods consistent with said objectives;
a uniform and systematic scaling operation consistent with said objectives; and
estimating said constant values based on an estimated size change of said layout elements consistent with said objectives.

31. The program storage device in claim 28, wherein said wherein said substituting process includes eliminating redundant formulae.

32. The program storage device in claim 28, wherein said optimizing process further comprises partitioning cells of the hierarchical integrated circuit layout into modifiable cells and cells having modifiable placements.

33. The program storage device of claim 28, wherein said optimizing process comprise one of an efficient graph based method, a linear programming method, and a rounding method.

34. The program storage device in claim 28, wherein all inequalities in said layout formulae comprise difference equations.

35. The program storage device of claim 28, wherein at least one of said simplified formulae comprises a two-variable sum inequality expression.

* * * * *